United States Patent [19]
Kessler, Jr.

[11] 3,984,861
[45] Oct. 5, 1976

[54] TRANSCALLENT SEMICONDUCTOR DEVICE

[75] Inventor: Sebastian William Kessler, Jr., Lancaster, Pa.

[73] Assignee: RCA Corporation, New York, N.Y.

[22] Filed: Jan. 9, 1975

[21] Appl. No.: 539,850

[52] U.S. Cl. .................. 357/82; 357/81; 357/79; 165/80; 174/52 S
[51] Int. Cl.² .............. H01L 25/04; H01L 23/02; H01L 23/42; H01L 23/44
[58] Field of Search .............. 357/81, 82, 83, 79; 165/105, 80; 174/52 S

[56] References Cited
UNITED STATES PATENTS

| | | |
|---|---|---|
| 3,739,235 | 6/1973 | Kessler .................. 357/82 |
| 3,826,957 | 7/1974 | McLaughlin et al. .......... 357/82 |
| 3,852,804 | 12/1974 | Corman et al. .............. 357/82 |
| 3,852,805 | 12/1974 | Brzozowski ................ 357/82 |

*Primary Examiner*—Andrew J. James
*Attorney, Agent, or Firm*—Glenn H. Bruestle; George E. Haas

[57] ABSTRACT

Metal plates of tungsten or molybdenum, having an optimum thickness of 1000 micrometers or less, are bonded to respective cathode and anode electrical coatings on the opposed major surfaces of a semiconductor wafer. The metal plates in turn are conductively bonded to the heat pipe walls which are used as the electrical connectors between the anode and cathode coatings and the external working circuit. Heat that is developed by the surge current flowing through the wafer during the first 6 milliseconds, is dissipated into the plates that are bonded to the opposed major surfaces of the wafer, before the cooling capability of the heat pipes is effective. This provides a greater surge current capability for the semiconductor wafer.

3 Claims, 3 Drawing Figures

TRANSCALLENT SEMICONDUCTOR DEVICE

This invention is directed to a semiconductor device of the type requiring cooling during its use. Such semiconductor devices include thyristors or silicon-controlled rectifiers which operate in conductive states wherein the current flow through the device produces a relatively large amount of heat, which must be dissipated to prevent breakdown or destruction of the device. Different types of cooling means have been used, one type of which is a heat pipe structure to which this invention relates.

BACKGROUND OF THE INVENTION

A semiconductor device, such as a thyristor or silicon controlled rectifier, may be cooled by a pair of heat pipe structures that are fixed to the opposed major surfaces of the wafer, which forms the semiconductor portion of the device. A semiconductor device of this type is described in detail in U.S. Pat. No. 3,739,235 issued to Sebastian William Kessler, Jr. on June 12, 1973. The semiconductor wafer normally has a conductive cathode electrode coating on one major surface of the wafer and a conductive anode electrode coating on the opposite major surface of the wafer. Surrounding the cathode electrode coating on the same major surface of the wafer and electrically insulated from it, there is normally an annular conductive electrode coating forming the gate electrode of the device. One heat pipe structure is bonded to the cathode electrode coating while the second heat pipe structure is bonded to the anode electrode coating on the opposite wafer surface. Heat developed in the wafer during the operation of the device flows from the wafer into the two respective heat pipe structures where it is dissipated.

For many applications of thyristors, the current rating of the device is its surge current capability rather than its continuous current rating. The reason for this is that many uses of these devices are for motors and contactor, where a high short-circuit current occurs. The lower the temperature of the semiconductor wafer of these devices during a surge of current, the greater is the surge current capability of the device. It has been found that a semiconductor device, such as a transcalent thyristor, which is cooled with heat pipes has a higher continuous current rating per unit area of the emitter than when the device is cooled by other means. However, the surge capability of the device is only slightly better than these similar devices that are cooled by other means.

An analysis of the operation of semiconductor transcalent thyristors shows that the cooling of the semiconductor device by the heat pipe structures does not begin until 5 to 6 milliseconds after the current starts to flow. Any cooling during the first 5 to 6 milliseconds is due to the volume heat capacity of the materials adjacent to the major surfaces of the semiconductor wafer. In these semiconductor devices, the porous wick structure of the heat pipes is in direct contact with the cathode and anode electrode coatings respectively. This wick structure has 54% of the density of solid copper metal and is filled with water. Although the water has a large specific heat, it contributes little to the heat capacity of the wick because its density and its thermal conductivity are small. The poor thermal conductivity of the water limits the rate with which it is able to absorb the heat. For these reasons then, the heat pipes bonded to the semiconductor wafer lag in their heat dissipation after the current flow has started during the initial current surge.

When current initially begins to flow through the device, during the first ½ cycle of a 60 Hz current, for example, the peak surge of current can be one of 10,000 amperes at 5 volts, or with 50 kilowatts of power. If the heat generated is not instantly absorbed or dissipated, the device can be destroyed. This dissipation of heat must occur during the first ¼ to ½ cycle of operation.

SUMMARY OF THE INVENTION

Therefore, in accordance with embodiments of the invention a semiconductor device comprises a semiconductor wafer having at least one major surface and a heat pipe including a hermetically closed envelope. The heat pipe envelope comprises a metal wall portion substantially conforming with and fixed to the major surface of the wafer. The wall portion of the envelope has a coefficient of thermal expansion conforming closely with the material of the wafer and is tightly bonded to the wafer surface with a solid bond making a good thermal contact to the wafer surface and providing good thermal conductivity between the wafer and heat pipe. This particular heat pipe design increases the surge current capability of the semiconductor device and permits it to operate at a lower temperature during the first ½ cycle of operation.

Figure 1:
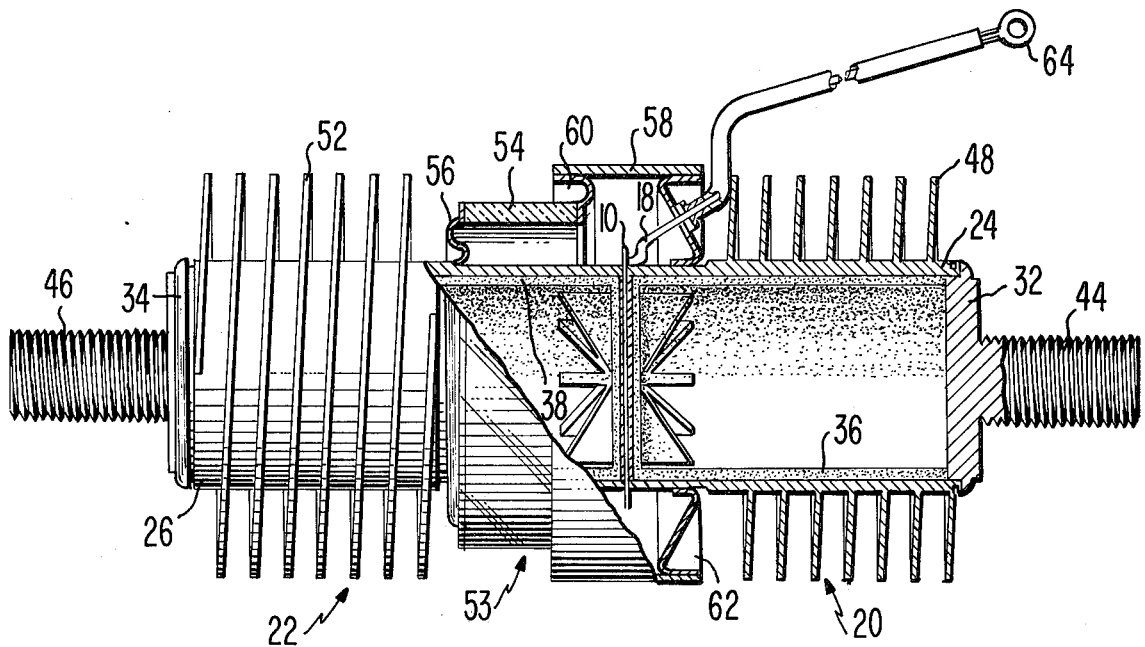
FIG. 1 is a longitudinal view, partially in section, of a semiconductor thyristor cooled by heat pipe structures, in accordance with an embodiment of the invention.
Figure 2:
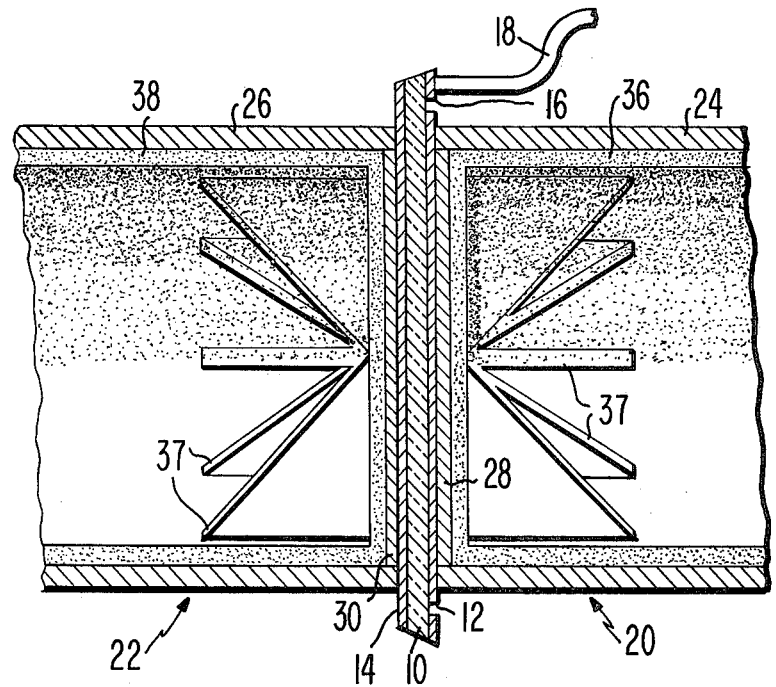
FIg. 2 is an enlarged sectional view of a portion of the semiconductor device of FIG. 1.

An embodiment of the invention is shown in FIGS. 1 and 2, as a semiconductor thyristor cooled by heat pipe structures bonded to the thyristor. The semiconductor device may be, for example, of the type described in detail in U.S. Pat. No. 3,739,235, referred to above. The device comprises a semiconductor wafer 10 of silicon which is formed of layers of doped semiconductor material providing an NPNP semiconductor thyristor device. Shown in detail in FIG. 2, the layered wafer 10 includes on one major surface a cathode electrode conductive coating 12 and on the opposite major surface of the wafer a conductive anode electrode coating 14. Although not shown in the figures, the configuration of the wafer 10 is that of a substantially round disc.

On the one major surface of the wafer 10 and adjacent to the cathode electrode coating 12 and insulatingly spaced therefrom is an annular conductive coating 16 forming the gate electrode. A conductive metal lead structure 18 is brazed to the gate electrode 16. Bonded directly to the opposed major surfaces of the semiconductor 10 are two heat pipes respectively, 20 and 22. The heat pipes include two hermetically sealed envelopes comprising copper cylinders 24 and 26. One open end of the cylinder 24 is hermetically closed by a metal wall portion consisting of a round metal plate 28 metal-brazed around its periphery across and to the open end of the cylinder 24. In a smiliar manner, the corresponding open end of the cylinder 26 is hermetically closed by a second metal plate 30 metal-brazed around its periphery and across its open end. The opposite ends of cylinders 24 and 26 are hermetically closed as by brazing by respective plates 32 and 34, as indicated in FIG. 1. The cylinders 24 and 26 are metal-brazed directly to the respective electrode conductive coatings 12 and 14.

The opposed major surface areas of the wafer 10 are flat. The conductive electrode coatings 12 and 14 conform with these surfaces. Plates 28 and 30 form wall portions of the respective heat pipe envelopes and are formed flat to conform with the flat electrode coatings 12 and 14. The plates 28 and 30 are bonded across their surfaces with a solid metal bonding to the coatings 12 and 14, respectively. The bonding is a metal-brazing or soldering of all of the conforming surface areas of plates 28 and 30 to the respective electrode coatings 12 and 14. This solid bonding of the heat pipe wall formed by plates 28 and 30 to the wafer provides good thermal contact between these parts, which in turn provide good thermal and electrical conductivity between the wafer 10 and heat pipes 20 and 30.

The inner surfaces of both of the heat pipes 20 and 22 are covered with a capillary wick structure, which extends over and is bonded tightly to the inner surfaces of the closed cylinders 24 and 26, respectively. As shown, a capillary wick liner 36 is bonded to the inner surface of the cylinder 24 and across the inner surface of the end plate 28. In a similar manner, a capillary wick liner 38 extends over and is bonded to the inner surface of cylinder 26 and continuously over the respective end plate 30.

As is well known and as described in the above cited U.S. Pat. No. 3,739,235, the wick liners 36 and 38 consist primarily of porous copper layers, in which an amount of a working fluid, such as water, is used. In the operation of the device, heat generated by current flow through the semiconductor wafer 10 is conducted away from the wafer by the two heat pipes 20 and 22. Water within the capillary liners 36 and 38 is evaporated from the portions of the heat pipe liners adjacent to the major surfaces of the semiconductor wafer 10. The water vapor formed from the evaporation condenses on the cooler walls of the two heat pipes, which are removed from the semiconductor wafer. The condensed water flows back through the capillary wick liners 36 and 38 toward the end portions of the heat pipes which are attached to the opposed surfaces of the wafer 10. The water is distributed over the plates 28 and 30 by triangularly shaped vanes 37 formed of the porous copper wick material and extending integrally from the walls of cylinders 24 and 26 to the centers of the respective plates 28 and 30.

To further aid in the cooling of the heat pipe cylinders, a spiral thin metal fin structure 48 is bonded to the external surface of cylinder 24 and a similar fin structure 52 is bonded to the external surface of cylinder 26. These fins 48 and 52 provide a greater surface area for air-cooling of the outer surfaces of the heat pipe cylinders 24 and 26, respectively.

The cylinder 24 provides an electrical cathode lead from an external circuit to the cathode electrode coating 12 and the heat pipe cylinder 26 provides the anode lead directly to the anode electrode coating 14. The external circuit is connected to the cylinders 24 and 26 by a threaded cathode bolt 44 fixed to the end plate 32 of the cylinder 24 and a threaded anode bolt 46 connected to the end plate 34.

The two heat pipes 20 and 22 have hermetically closed envelopes formed respectively by the cylinder 36 and the end plates 28 and 32 and the cylinder 38 with its end plates 30 and 34. To further protect and shield the exposed portions of the semiconductor wafer 10 there is provided another envelope structure 53 extending between the two heat pipes. This envelope structure includes a ceramic cylinder 54 coaxially positioned around the heat pipe cylinder 26 and bonded to the wall of cylinder 26 by a copper, flanged-disc 56 brazed at its outer periphery to one end of the ceramic cylinder 54 and at its thinner periphery to the outer wall of cylinder 26. As schematically shown in FIG. 1, the ring 56 is of a corrugated construction to relieve the difference in thermal expansion of the connected parts.

Envelope structure 53 also includes a weld sleeve 58 made of Kovar (Trade Mark), for example, attached to the ceramic ring 54 by an annular ring 60 brazed to one end of the Kovar sleeve 58 and joined at its inner periphery to the other end of the ceramic ring 54. The other end of the weld sleeve 58 is bonded to the outer surface of the heat pipe cylinder 24 by means of the annular ring 62, which is brazed at its outer periphery to the other end of the Kovar weld sleeve 58 and at its inner periphery to the outer surface of cylinder 24. The lead 18 to the gate electrode coating 16 extends through an opening in the ring 62 and is attached to a lead terminal 64, as indicated in FIG. 1 and is used to connect the gate electrode into the external working circuit. The annular rings 56, 60 and 62 are of an irregular cross-sectional design to provide strain isolation connections between the rings 54 and 58 and the cylinders 24 and 26.

As described above, the surge current capability of thyristor devices of the type shown in FIGS. 1 and 2, in many applications depends upon their capability of absorbing a high current surge without failure. The current surge normally is that provided by the initial current within the first 5 to 6 milliseconds of operation. It is necessary that the semiconductor devices be protected from a high temperature operation, at which the device will fail. As set forth above the poor thermal conductivity of the water used in the heat pipes and the lessened heat conductivity of the porous copper of the wick do not provide sufficient cooling during the initial portion of the current surge.

In accordance with the invention, it was found that the use of the metal end plates 28 and 30 provides a considerable increase in the cooling of the semiconductor device during the initial surge portion of the operating current. It was found that the metal plates 28 and 30 bonded directly to the respective electrode coatings 12 and 14 provide a structure which initially absorbs and stores the heat formed in the semiconductor 10 during the surge portion of the current. The heat storing capability of plates 28 and 30 effectively dissipates the heat from the semiconductor 100, so that the maximum temperature at which the semiconductor 10 operates during the initial surge current is lowered by 60° to 70°C. This, then, enables the semiconductor to operate at a higher surge current and provides greater utility for the semiconductor device.

Figure 3:
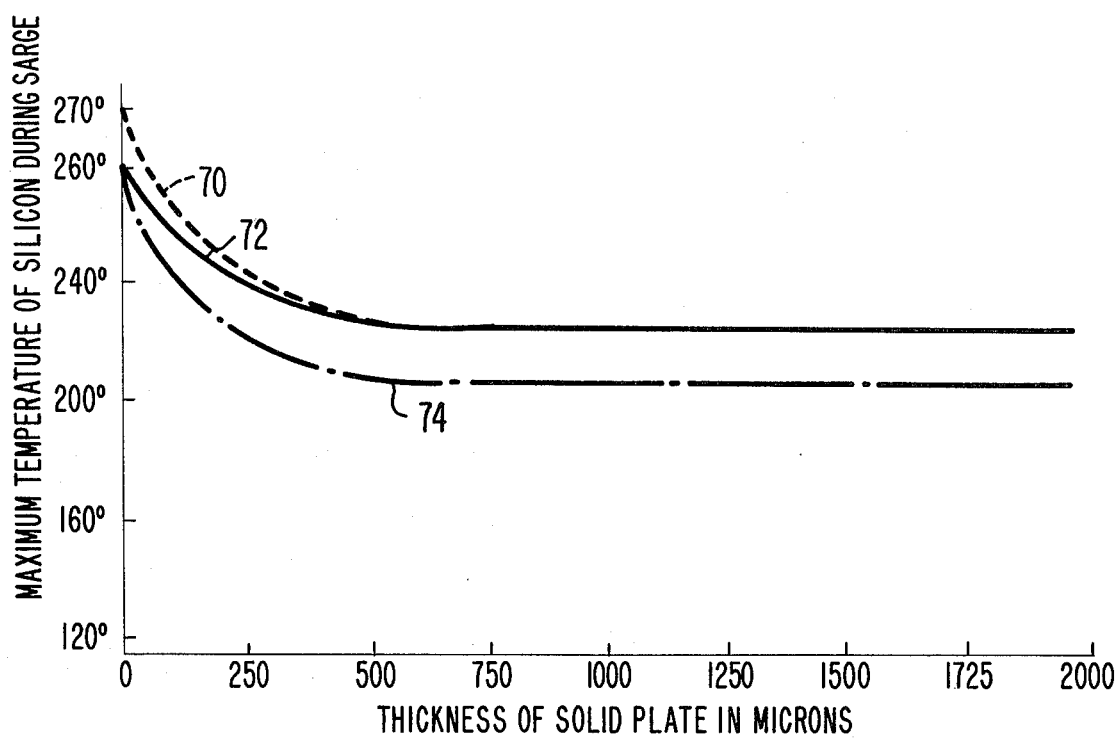
FIG. 3 is a graph schematically disclosing the maximum temperatures calculated during operation of semiconductor devices of the type shown in FIGS. 1 and 2.

FIG. 3 discloses the maximum temperature conditions which silicon semiconductor thyristors of the type described above, experienced within the six milliseconds after the application of a peak power surge of 53.9 kilowatts of the first half cycle of a 60 Hz current. The tests were run with different thicknesses of metal plates 28 and 30 and with metal plates made of tungsten and copper in combiination with different types of porous wick constructions. For example, curve 70 represents the maximum temperatures observed under the peak power conditions by the thyristor device when no plates 28 and 30 were used and when the plates were formed of tungsten metal and were of different thicknesses for a series of tests. During these tests the wick material 36 and 38 used was of a porous silver metal. Curve 70 indicates that without the use of plates 28 and 30 and with the silver wick liners, the initial maximum temperature the silicon wafer reached was around 270°C. By using tungsten plates of different thicknesses, the maximum temperature reached during the first six milliseconds of the initial surge conditions could be lowered to a temperature of about 220°C.

If the wick structure were formed of porous copper, results represented by curve 72 were obtained by the use of tungsten plates 28 and 30 of varying thicknesses. The copper wick alone held the temperature of the device to around 260°C. The use of tungsten plates of increasing thickness lowered the initial maximum temperature of the device to about 220°C. Curve 74 indicates the maximum temperatures measured when copper plates were utilized for the end plates 28 and 30, in combination with copper wick liners 36 and 38. With this arrangement, different thicknesses of the copper plates 28 and 30 lowered the maximum temperature under the given conditions to a minimum of around 200°C.

The results shown in FIG. 3 indicate that the maximum temperatures experienced by the semiconductor devices in the initial 6 milliseconds of the first half cycle of the power surge were lower with the use of end plates 28 and 30 bonded directly to the electrode coatings on the opposite major surfaces of the semiconductor 10. As mentioned above, these plates apparently are able to absorb and store the developed heat in the very short time when the surge current conditions of the device are experienced. This is the time before the cooling capabilities of the heat pipes are effective to dissipate the heat from the wafer 10. The device then is able to operate at higher surge currents than possible without the plates 28 and 30. The results shown in FIG. 3 indicate, furthermore, that during the operation of the device, the presence of the metal plates 28 and 30 prevents the temperature of the semiconductor device rising to a value it would have without the plates.

FIG. 3 further shows that the use of end plates 28 and 30, which are thicker than 1000 microns, do not improve the operating characteristics of the semiconductor device and are not beneficial in further lowering the operating temperatures, during the initial 6 milliseconds of the power surge. However, there is a disadvantage in using end plates thicker than 1000 microns, as the temperature differential between the silicon wafer 10 and the evaporator portions of the heat pipes will increase during continuous operation because the thermal conductivity of the metal plates 28 and 30 is not as great as the vapor space of the heat pipes. For example, a tungsten end plate having a thickness of 625 microns will have a temperature gradient of 2.45°C. A thicker end plate would have even a greater temperature gradient. Thus, it is seen that for the optimum surge current capability of the device and for also the optimum continuous current operation, there is an optimum thickness less than 1000 micrometers for the metal plate between the silicon wafer surface and the evaporator structure of the heat pipe.

In the test results indicated in FIG. 3, tungsten and copper end plates were used. However, copper is not the best thermal match for the silicon of the wafer 10 and does not retain its bond to the surface of the silicon as well as other metals, such as tungsten and molybdenum, which have thermal expansion characteristics which more closely match that of the silicon of wafer 10. Silver can also be used for the plates 28 and 30.

The plates 28 and 30 conduct the current from all portions of the respective electrode coatings 12 and 14 to which they are conductively brazed. The current conduction is uniformly from plates 28 and 30 to the cylinders 36 and 38, acting as the respective cathode and anode leads of the device. Thus, the plates 28 and 30 serve to prevent the occurrence of "hot spots" in the conductive coatings 12 and 14, which would cause the device to break down.

A preferred embodiment of the invention utilizes copper cylinders 24 and 26, which are machined to provide the desired wall thickness of around 0.038 cm. Molybdenum end plates 28 and 30 are brazed into the opposite ends of cylinders 24 and 26 with a gold-nickel alloy composition. The inner surfaces of cylinders 24 and 26 and those of end plates 28 and 30 are nickel plated. The outer surfaces of plates 28 and 30 are ground to provide an accurate flatness of the surfaces, so as to form a good matching fit to the respective flat opposed surfaces of wafer 10. These matching surfaces of the wafer 10 and the plates 28 and 30 are solidly metal-brazed or soldered together so that the electrode coatings 12 and 14 are completely bonded over their surfaces to the respective plates 28 and 30. The semiconductor wafer may be formed in the manner disclosed in the above cited U.S. Pat. No. 3,739,235 with the opposed electrode coatings 12 and 14 respectively brazed to the ends of cylinders 24 and 26.

The wick liners 36 and 38, inside the cylinders 24 and 26 are formed somewhat in the manner described in British Pat. No. 1,361,269 issued to RCA Corporation. Such a method includes the use of a cylindrical mandrel of less diameter than the inner diameter of cylinders 24 and 26. The mandrel is of a cylindrical configuration and is coaxially mounted within the heat pipe cylinder so that it is spaced from the walls of the cylinder a distance equal to the desired thickness of the capillary wick liners. The space between the mandrel and the inner surfaces of the cylinders 24 and 26 is filled with a fine copper powder, of which the copper particles have been silver plated, in the manner described in the above mentioned British patent. The fine powder fills the space between the mandrel and the inner wall of the heat pipe cylinder. The end of the mandrel is appropriately slotted and the powder will fill the slots to form the vane 37. The mandrel is normally of stainless steel having a chromic oxide formed on its surface.

The cylinders with their mandrels filled with a powdered wick material are then heated to a temperature at which the silver plated copper powder fuses together to provide the porous wick liner constructions indicated at 36 and 38. The heat pipe cylinders then are stacked together with the semiconductor wafer 10 in between. Using an appropriate solder material, the cylinders 24 and 26 and their respective end plates 28 and 30 are bonded by metal brazing directly to the electrode coatings 12 and 14. The brazing of the heat pipes to the semiconductor surfaces may be done separately or simultaneously during the heating of the pipes to form the wick liners within the two cylinders 24 and 26. After the heat pipes have been assembled to the wafer 10, the wafer envelope 53 consisting of the ceramic cylinder 54 and the weld sleeve 58 may be assembled to the cylinders 24 and 26. This assemblying of the envelope 53 to the ceramic wafer 10 may also be done during the heating and brazing of the other parts of the semiconductor device.

I claim:

1. A semiconductor device comprising a semiconductor wafer having at least one major surface, a heat pipe including an hermetically closed envelope, said envelope comprising a metal wall portion substantially conforming with and fixed to said major surface, said wall portion having a coeffcient of thermal expansion conforming closely with the material of said wafer and being tightly bonded to said wafer surface with a solid bond making a good thermal contact to said wafer surface providing good thermal conductivity between said wafer and said heat pipe, said wall portion having uniform thickness between 500 to 1,000 micrometers inclusive.

2. A semiconductor device in accordance with claim 1, wherein said conforming wall portion of said heat pipe is formed of one of the metals molybdenum, tungsten, copper or silver.

3. A semiconductor device in accordance with claim 1, wherein said semiconductor wafer has two opposed major surfaces and said heat pipe is one of two heat pipes, the other one of said heat pipes comprising another hermetically closed envelope having a metal wall portion conforming to and fixed to the major surface of said wafer opposed to said one major surface with a solid bond making a good thermal contact with said opposed major surface, said conforming wall portions having a uniform thickness of less than 1000 micrometers.

* * * * *